(12) United States Patent
Kondo et al.

(10) Patent No.: US 7,302,665 B2
(45) Date of Patent: Nov. 27, 2007

(54) METHOD AND APPARATUS FOR DESIGNING A LAYOUT, AND COMPUTER PRODUCT

(75) Inventors: Eiji Kondo, Kawasaki (JP); Koji Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 165 days.

(21) Appl. No.: 10/962,672

(22) Filed: Oct. 13, 2004

(65) Prior Publication Data

US 2005/0289493 A1   Dec. 29, 2005

(30) Foreign Application Priority Data

Jun. 15, 2004   (JP) .............. 2004-177478

(51) Int. Cl.
*G06F 17/50*   (2006.01)
(52) U.S. Cl. .......................................... 716/13; 716/14
(58) Field of Classification Search ...................... None
See application file for complete search history.

(56) References Cited

U.S. PATENT DOCUMENTS

| | | | |
|---|---|---|---|
| 4,713,773 A * | 12/1987 | Cooper et al. ................ | 716/15 |
| 4,903,214 A * | 2/1990 | Hiwatashi .................... | 716/14 |
| 5,264,390 A * | 11/1993 | Nagase et al. ............... | 438/599 |
| 5,671,397 A * | 9/1997 | Crafts ........................... | 716/17 |
| 6,182,272 B1 * | 1/2001 | Andreev et al. ............... | 716/13 |
| 6,704,918 B1 * | 3/2004 | Ali et al. ....................... | 716/12 |
| 6,766,503 B2 * | 7/2004 | Fitzhenry et al. ............. | 716/12 |
| 6,823,499 B1 * | 11/2004 | Vasishta et al. ................ | 716/7 |

FOREIGN PATENT DOCUMENTS

| | | |
|---|---|---|
| JP | 1-207947 | 8/1989 |
| JP | 5-160375 | 6/1993 |
| JP | 5-181936 | 7/1993 |
| JP | 7-86404 | 3/1995 |

OTHER PUBLICATIONS

T.Koide et al., "A New Global Routing Algorithm for Over-the-Cell Routing in Standard Cell Layouts," 1993 IEEE, pp. 116-121.*
"Fujitsu Releases AccelArray™ Structured ASIC Devices," *FUJITSU*, Jun. 26, 2003.

* cited by examiner

*Primary Examiner*—Leigh M. Garbowski
(74) *Attorney, Agent, or Firm*—Staas & Halsey LLP (57) ABSTRACT

An apparatus for designing a layout includes an arranging unit that arranges, on a large-scale-integrated chip, a cell in which a signal line segment that is not connected to a terminal is formed; a wiring unit that wires a signal line to an arbitrary wiring layer of the large-scale-integrated chip; and a connecting unit that connects the signal line segment with the signal line.

12 Claims, 9 Drawing Sheets

METHOD AND APPARATUS FOR DESIGNING A LAYOUT, AND COMPUTER PRODUCT

CROSS-REFERENCE TO RELATED APPLICATIONS

This application is based upon and claims the benefit of priority from the prior Japanese Patent Application No.2004-177478, filed on Jun. 15, 2004, the entire contents of which are incorporated herein by reference.

BACKGROUND OF THE INVENTION

1) Field of the Invention

The present invention relates to a technology for designing a large-scale-integrated (LSI) chip layout.

2) Description of the Related Art

Conventionally, two-stage wiring has been performed in a layout of the LSI chip. In the two-stage wiring, the LSI chip is divided into a plurality of lattices by using a net of a user from a net list, an ideal wiring routine is searched by a computer aided design (CAD), and global wiring is performed. Then, detailed wiring inside each of the lattices is performed. The technologies used for the two-stage wiring are disclosed in, for example, Japanese Patent Application Laid-Open Publication No. H1-207947, Japanese Patent Application Laid-Open Publication No. H5-160375, Japanese Patent Application Laid-Open Publication No. H5-181936, and Japanese Patent Application Laid-Open Publication No. H7-86404.

Recently, to reduce man-hours required for timing closure work and designing time, a structured application specific integrated circuit (ASIC) that is designed in advance, and in which a SCAN circuit and a built-in self-test (BISt) circuit are embedded, has been developed. In this structured ASIC, from among wiring levels are shared and the rest of the wiring layers are customized-wiring layers that can be customized depending on specifications of a user.

However, in the conventional technologies disclosed in Japanese Patent Application Laid-Open Publication No. H1-207947, Japanese Patent Application Laid-Open Publication No. H5-160375, Japanese Patent Application Laid-Open Publication No. H5-181936, and Japanese Patent Application Laid-Open Publication No. H7-86404, when the global wiring in each lattice of the LSI chip passes through a cell that is arranged in the lattice, the detailed wiring is performed in such a manner that the cell in the lattice in one of the layers is by-passed or by by-passing through other wiring layer.

Therefore, in the structured ASIC, if the layout designing is carried out by the detailed wiring, a wiring pattern of the customized wiring layer may differ in each of the LSI chip. Therefore, a manufacturing process of the LSI chip becomes complicated and the time required for manufacturing increases. As a result, there is an increase in the manufacturing cost.

SUMMARY OF THE INVENTION

It is an object of the present invention to solve at least the above problems in the conventional technology.

An apparatus for designing a layout according to one aspect of the present invention includes an arranging unit that arranges, on a large-scale-integrated chip, a cell in which a signal line segment that is not connected to a terminal is formed; a wiring unit that wires a signal line to an arbitrary wiring layer of the large-scale-integrated chip; and a connecting unit that connects the signal line segment with the signal line.

An apparatus for designing a layout according to another aspect of the present invention includes a first inputting unit that inputs first information related to a cell in which a fixed-signal line that is not connected to a terminal is formed, to arrange the cell on a large-scale-integration chip; a second inputting unit that inputs second information related to a signal line to wire the signal line in an arbitrary wiring layer of the large-scale-integration chip; and a connecting unit that connects third information related to the fixed-signal line that is included in the first information with the second information.

A method for designing a layout according to still another aspect of the present invention includes arranging, on a large-scale-integrated chip, a cell in which a signal line segment that is not connected to a terminal is formed; wiring a signal line to an arbitrary wiring layer of the large-scale-integrated chip; and connecting the signal line segment with the signal line.

A method of designing a layout according to still another aspect of the present invention includes inputting first information related to a cell in which a fixed-signal line that is not connected to a terminal is formed, to arrange the cell on a large-scale-integration chip; inputting second information related to a signal line to wire the signal line in an arbitrary wiring layer of the large-scale-integration chip; and connecting third information related to the fixed-signal line that is included in the first information with the second information.

A computer readable recording medium according to still another aspect of the present invention stores a computer program for designing a layout, making a computer execute arranging, on a large-scale-integrated chip, a cell in which a signal line segment that is not connected to a terminal is formed; wiring a signal line to an arbitrary wiring layer of the large-scale-integrated chip; and connecting the signal line segment with the signal line.

A computer readable recording medium according to still another aspect of the present invention stores a computer program for designing a layout, making a computer execute: inputting first information related to a cell in which a fixed-signal line that is not connected to a terminal is formed, to arrange the cell on a large-scale-integration chip; inputting second information related to a signal line to wire the signal line in an arbitrary wiring layer of the large-scale-integration chip; and connecting third information related to the fixed-signal line that is included in the first information with the second information.

The other objects, features, and advantages of the present invention are specifically set forth in or will become apparent from the following detailed description of the invention when read in conjunction with the accompanying drawings.

DETAILED DESCRIPTION

Exemplary embodiments of a layout designing apparatus, a method of layout designing, a computer program for layout designing, and a recording medium according to the present invention are described below in detail with reference to the accompanying drawings. The layout designing apparatus and the method of layout designing can be realized with a CAD that includes the recording medium in which the computer program according to an embodiment is recorded.

Figure 1:
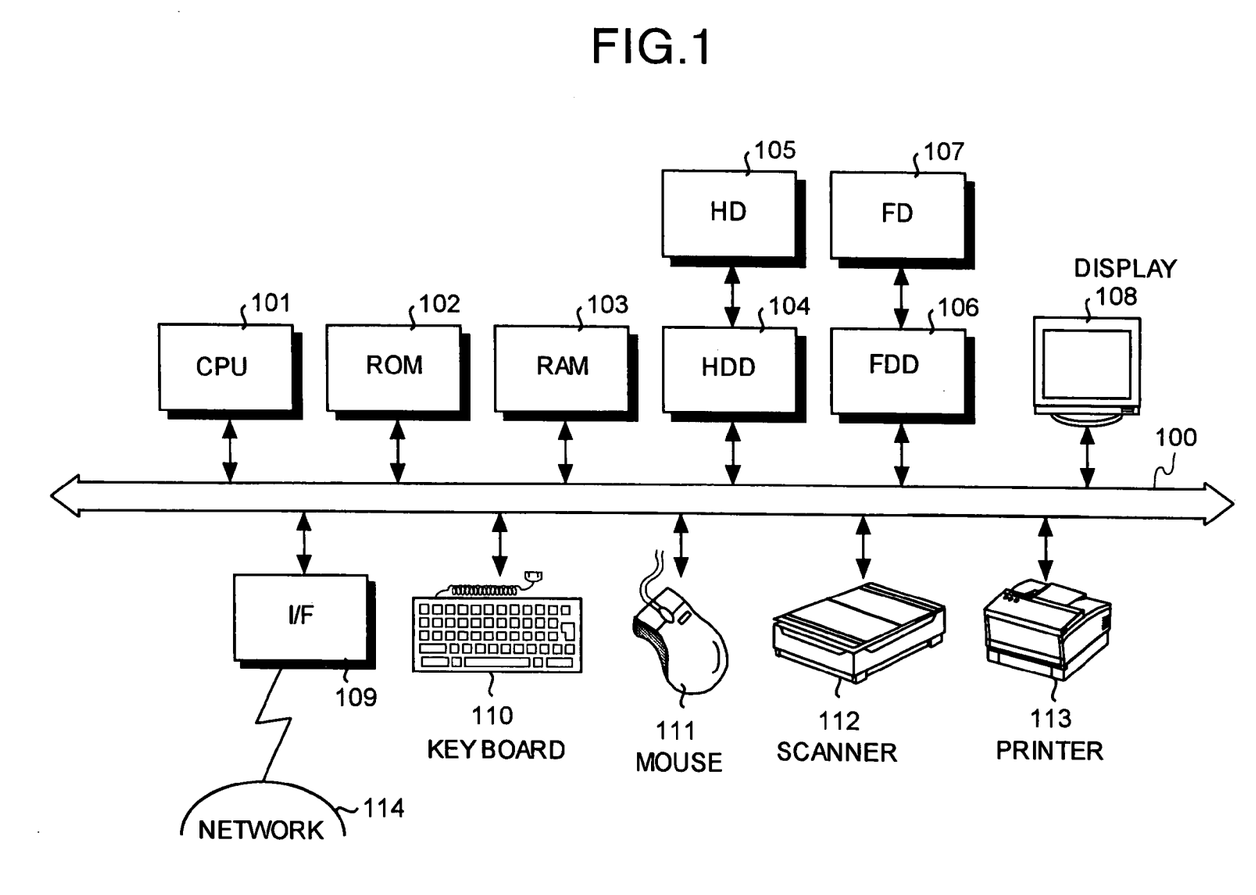
FIG. 1 is a hardware block diagram of a layout designing apparatus according to an embodiment of the present invention.

FIG. 1 is a block diagram of a hardware configuration of the layout designing apparatus according to the embodiment of the present invention.

In FIG. 1, the layout designing apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as a removable recording medium, a display 108, an interface (I/F) 109, a key board 110, a mouse 111, a scanner 112, and a printer 113. Each of components is connected through a bus 100.

The CPU 101 controls the layout designing apparatus. The ROM 102 stores computer programs such as a boot program. The RAM 103 is used as a work area of the the CPU 101. The HDD 104 controls reading/writing of data from/to the HD 105 in accordance with the control of the CPU 101. The HD 105 stores data that is written according to the control of the HDD 104.

The FDD 106 controls reading/writing of data from/to the FD 107 in accordance with the control of the CPU 101. The FD 107 stores data that is written by the control of the FDD 106 and enables the layout designing apparatus to read the data stored in the FD 107.

Apart from the FD 107, a compact disc-read only memory (CD-ROM), a compact disc-readable (CD-R), a compact disc-rewritable (CD-WR), a magnetic optical disc (MO), a digital versatile disc (DVD), and a memory card may also be used as the removable recording medium. The display 108 displays a curser, an icon, a tool box as well as data such as documents, images, and functional information. A cathode ray tube (CRT), a thin film transistor (TFT) liquid crystal display, a plasma display can be used as the display 108.

The I/F 109 is connected to a network 114 such as the Internet through a communication line and is connected to other devices via the network 114. The I/F 109 controls the network 114 and an internal interface to control input/output of data from external devices. A modem or a local area network (LAN) adapter can be used as the I/F 109.

The key board 110 includes keys for inputting characters, numbers, and various instructions, and is used to input data. A touch panel input pad or a numerical key pad may also be used as the key board 110. The mouse 111 is used to shift the curser, select a range, shift windows, and change sizes. A track ball or a joy stick may be used as a pointing device if similar functions are provided.

The scanner 112 reads an image optically and captures image data into the layout designing apparatus. The scanner 112 may be provided with an optical character read (OCR) function. The printer 113 prints the image data and document data. A laser printer and an inkjet printer can be used as the printer 113.

Figure 2:
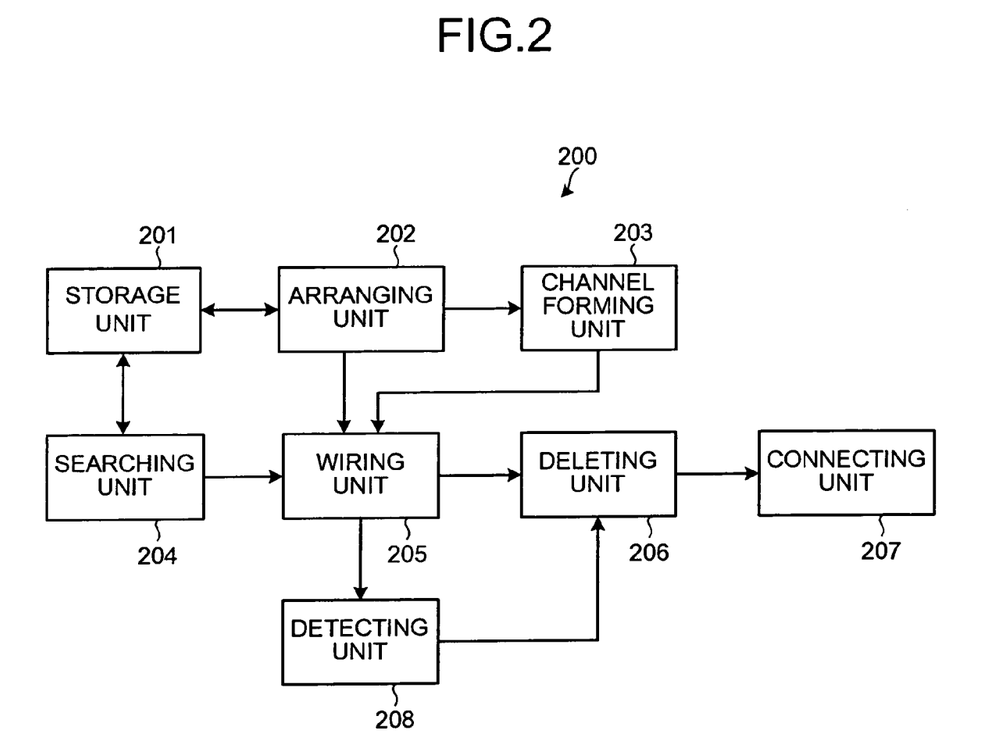
FIG. 2 is a functional block diagram of a configuration of the layout designing apparatus according to the embodiment of the present invention.

FIG. 2 is a functional block diagram of the layout designing apparatus according to the embodiment of the present invention. As shown in FIG. 2, a layout designing apparatus 200 includes a storage unit 201, an arranging unit 202, a channel forming unit 203, a searching unit 204, a wiring unit 205, a deleting unit 206, a connecting unit 207, and a detecting unit 208. The storage unit 201 stores a net list of a user. A function of the storage unit 201 can be realized with a readable and writable recording medium such as the RAM 103, the HD 105, and the FD 107 shown in FIG. 1.

The arranging unit 202 extracts the net list from the storage unit 201 and arranges, on an LSI chip, a cell in which a fixed-signal line segment that is not connected to a terminal is formed. The LSI chip, for example, is a structured ASIC that is designed in advance in which circuits such as a SCAN circuit and a BIST circuit are embedded. Concretely, it is a multi-layered wiring structure in which a plurality of wiring layers is provided on a semiconductor substrate.

The arranging unit 202, inputs cell data related to the cell so as to arrange, on the LSI chip the cell. The cell includes a macro cell that has a specific function such as a phase-locked loop (PLL) and an RAM. The fixed-signal line segment is a signal line segment that is not connected to a terminal of the cell and is specially prepared for the present embodiment.

Figure 3:
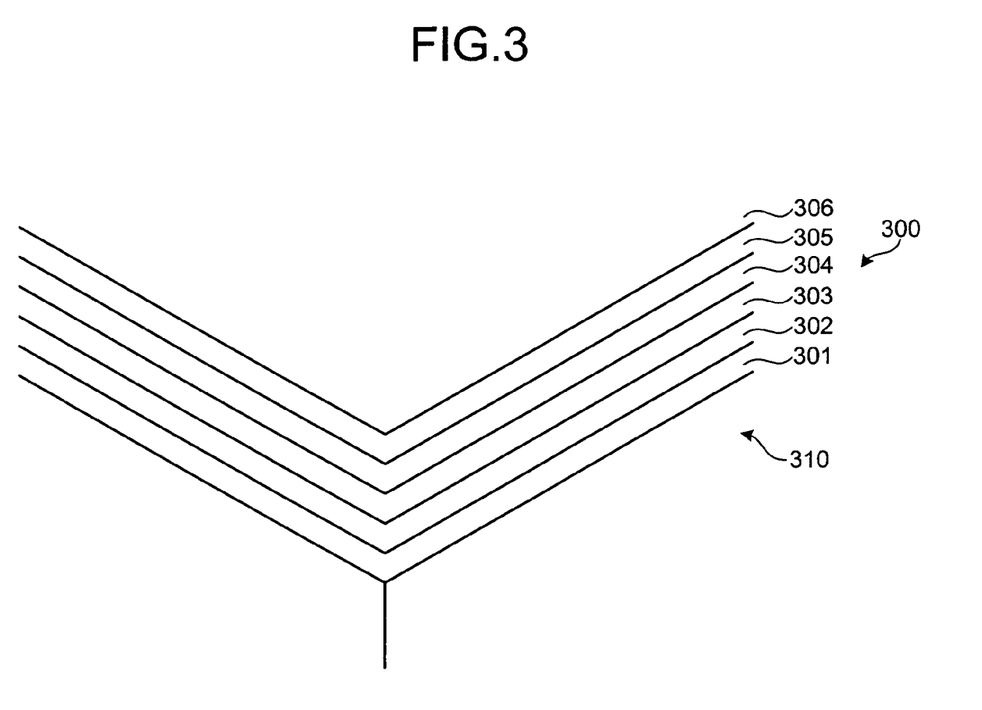
FIG. 3 is a perspective view of LSI chip data related to an LSI chip.

FIG. 3 is a perspective view of LSI chip data related to the LSI chip. As shown in FIG. 3, LSI chip data 300 includes substrate data 310 that is related to the semiconductor substrate, first wiring-layer data 301, second wiring-layer data 302, third wiring-layer data 303, fourth wiring-layer data 304, fifth wiring-layer data 305, and sixth wiring-layer data 306 that are related to a second to a sixth wiring-layers respectively. The second to the sixth wiring-layers are arranged on the semiconductor substrate. The first, the third, and the fifth wiring-layers have a same wiring direction, and the second, the fourth, and the sixth wiring-layers have a same wiring direction. The wiring direction of the first, the third, and the fifth wiring-layers is substantially orthogonal to the wiring direction of the second, the fourth, and the sixth wiring-layers.

Figure 4:
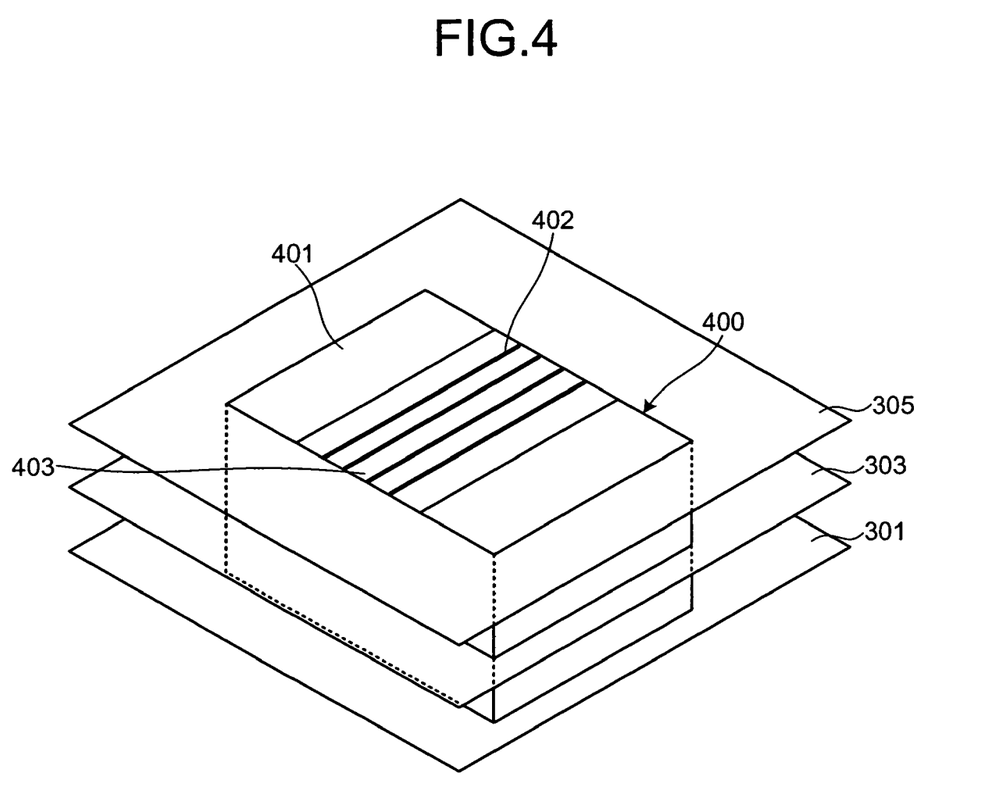
FIG. 4 is a perspective view of cell data 400 related to a cell that is arranged in an arbitrary lattice of the LSI chip.

FIG. 4 is a perspective view of cell data 400 related to the cell that is arranged in an arbitrary lattice of the LSI chip. The cell data 400 is information related to a cell in which a plurality of fixed-signal line segments (four line segments in FIG. 4) are formed on an upper surface of the cell.

The cell data 400 includes information of height (coordinate value in a direction of height) that expresses height from the outer surface (the first wiring-layer data 301) of the substrate. The fifth wiring-layer data 305 includes upper-surface data 401, fixed-signal line segment data 402, and a formation area 403. The upper-surface data 401 is related to the upper surface of the cell. The fixed-signal line segment data 402 is related to the fixed-signal line segments formed on the upper surface of the cell. The formation area 403 includes the fixed-signal line segment data 402.

The channel forming unit 203 forms a channel in an area that overlaps the cell arranged in the wiring-layers in which the fixed-signal line segments are not formed from among the wiring-layers. Concretely, by arranging the cell data 400, channel data related to a channel is created in wiring-layer data that does not include the fixed-signal line segment data 402. The wiring-layer data in which the channel data is created is wiring-layer data other than the wiring-layer data that includes the fixed-signal line segment data 402.

The wiring-layer data in which the channel data is created is wiring-layer data in a wiring-layer direction same as that of the fixed-signal line segment data 402. An area in which the channel data is created has same size as the formation area 403 of the fixed-signal line segment data 402, and has different coordinate value in the direction of height from the formation area 403.

Figure 5:
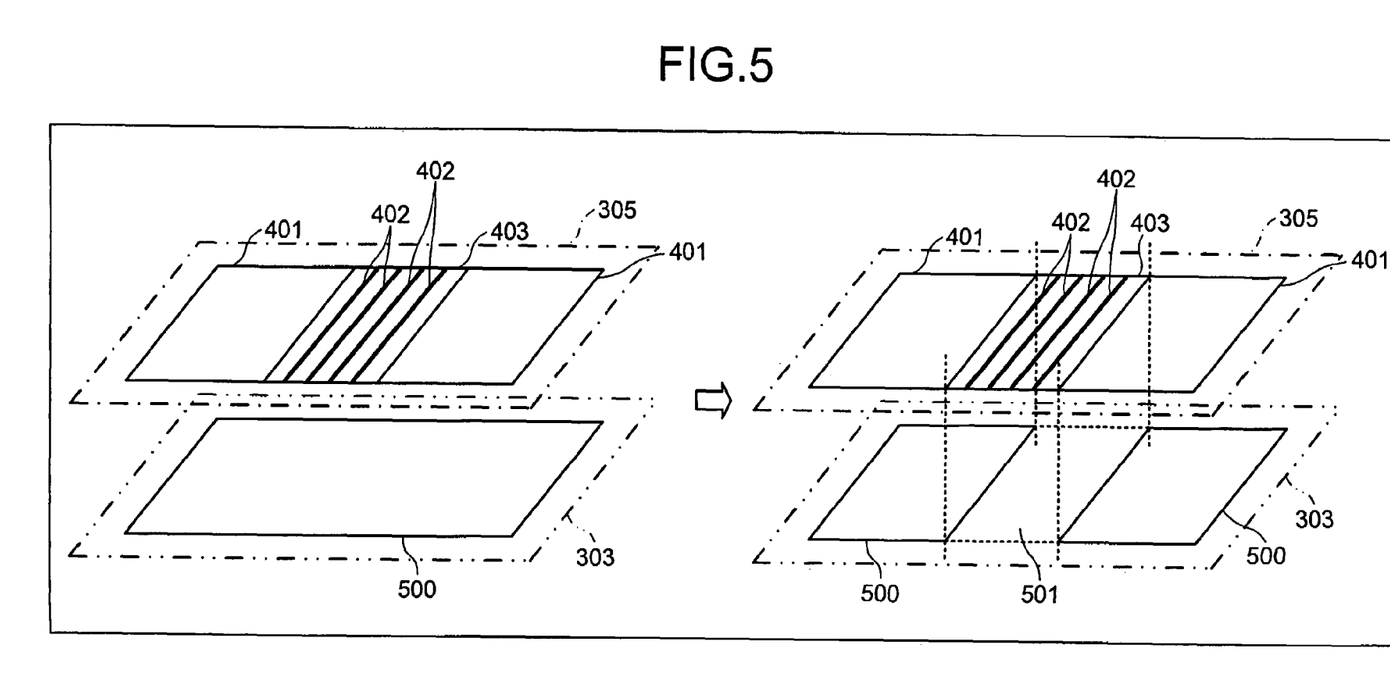
FIG. 5 is an explanatory diagram of channel formation according to the embodiment of the present invention.

The following is a concrete description of channel formation. FIG. 5 is an illustration of channel formation according to the embodiment of the present invention. By the cell arrangement shown in FIG. 4, the upper-surface data 401 of the cell that includes the fixed-signal line segment data 402 is formed in the fifth wiring-layer data 305 shown in FIG. 5. With this cell arrangement, the first wiring-layer data 301 or the third wiring-layer data 303 which has the same wiring direction is determined to be wiring data subjected to channel formation. In this example, the third wiring-layer data 303 is determined to be wiring data subjected to channel formation.

In the third wiring-layer data 303, from among the upper-surface data 401 of the cell data 400 of the arranged cell, an area for which only the coordinate value in the direction of height differs from that of the formation area 403 that includes the fixed-signal line segment 402, is designated and channel data 501 is formed in this designated area 500.

Figure 6:
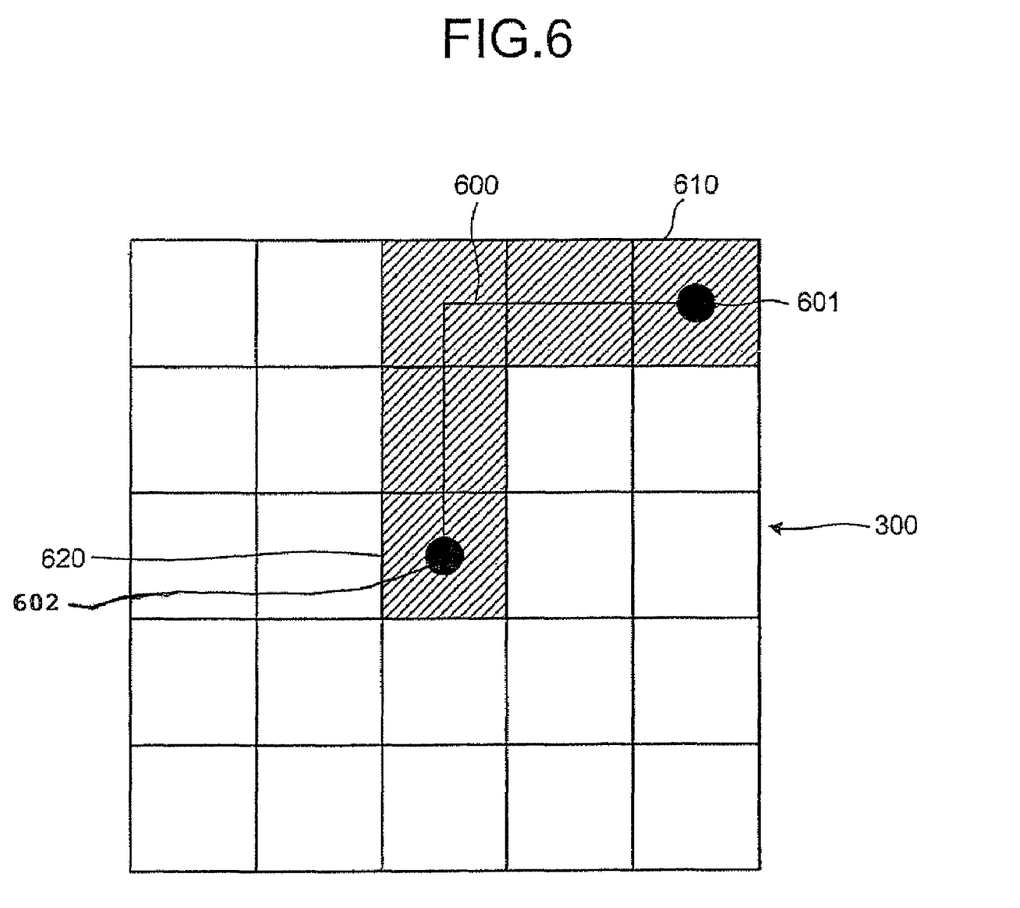
FIG. 6 is an example of a wiring routine that is searched.

The searching unit 204 extracts the net list from the storage unit 201 and searches a wiring routine of a global wiring that is wired on the LSI chip. FIG. 6 is an illustration of an example of the wiring routine that is searched. The LSI chip data 300 that performs designing of the LSI chip is divided into a plurality of lattice data and searches a wiring routine 600. The wiring routine 600 is the shortest routine from lattice data 610 that includes terminal information 601, which is an initial point, to lattice data 620 that includes terminal information 602, which is an ending point. The search can be performed by a known method such as Maze method.

The wiring unit 205 wires a signal line in a voluntary wiring layer of the LSI chip. Concretely, the wiring unit 205 inputs signal-line data related to the signal line to wire the signal line in the voluntary wiring layer of the LSI chip. The signal-line data is input by using the cell data 400 that is arranged by the arranging unit 202 (see FIG. 4), the channel data 501 that is formed by the channel forming unit 203 (see FIG. 5), and the wiring routine of the global wiring that is searched by the searching unit 204 (see FIG. 6).

Figure 7:
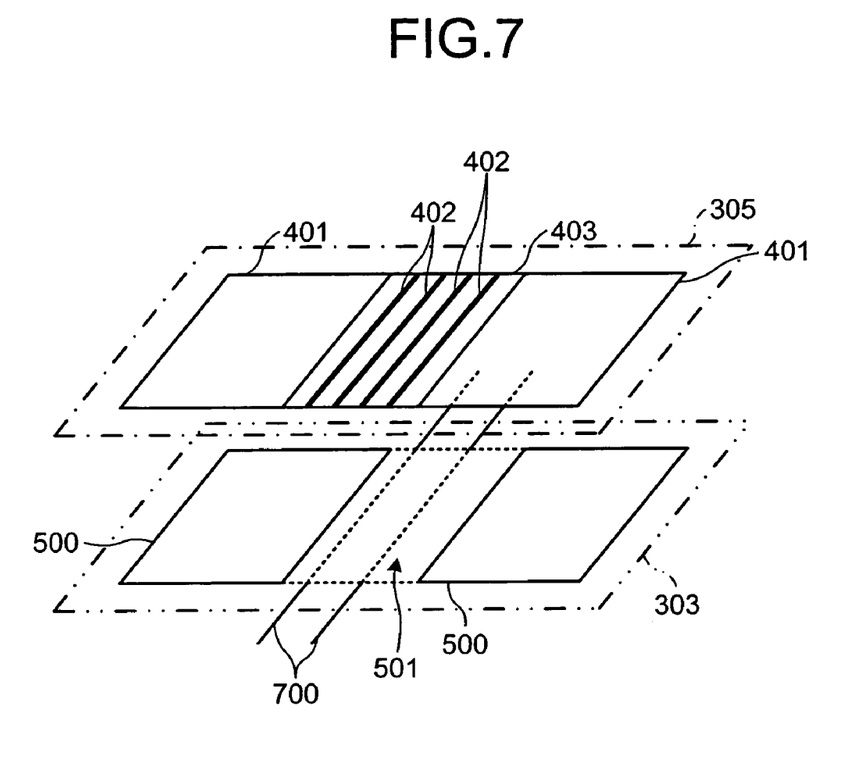
FIG. 7 is an explanatory diagram of a global wiring according to the embodiment of the present invention.

FIG. 7 is an illustration of the global wiring according to the present invention. The third wiring-layer data 303 that includes the channel data 501 shown in FIG. 5 is subjected to global wiring. In FIG. 7, global wiring data 700 is wired to the third wiring-layer data 303 according to the wiring routine 600 that is searched by the searching unit 204. The global wiring data 700 is wired such that when the global wiring data 700 passes through the cell data 400, it passes through the channel data 501.

Figure 8:
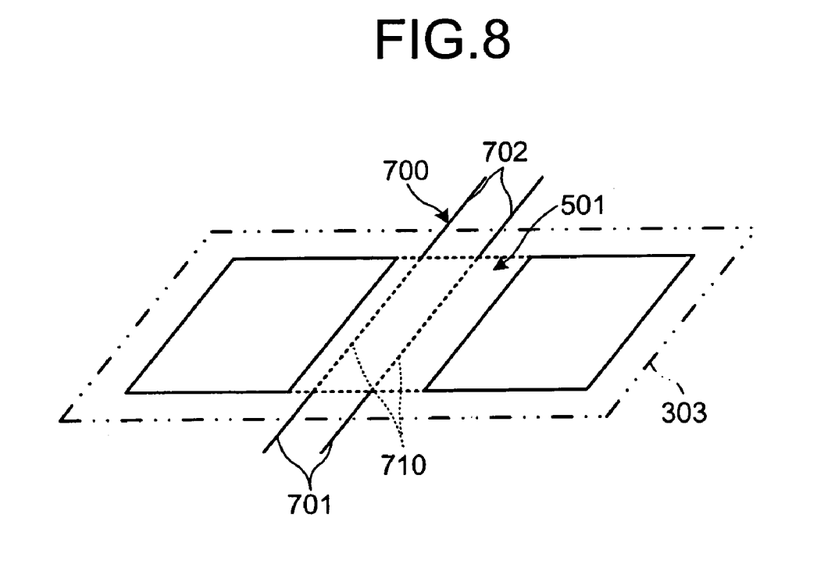
FIG. 8 is an explanatory diagram of wiring deletion according to the embodiment of the present invention.

The deleting unit 206 deletes a part of the signal line that passes through the cell that is arranged by the arranging unit 202. Concretely, from among the global wiring data 700 that is wired by the wiring unit 205, a part of the global wiring data that passes through the cell data of the cell that is arranged by the arranging unit 202, is deleted. The wiring deletion is described below in detail. FIG. 8 is an illustration of the wiring deletion according to the embodiment of the present invention. The third wiring-layer data 303 that includes the channel data 501 and the global wiring data 700 shown in FIG. 7 is subjected to wiring deletion.

In FIG. 8, from among the global wiring data 700 that is wired by the wiring unit 205, a part of global wiring data 710 that exists in the channel data 501 is deleted. The part of global wiring data 710 may be deleted by a designer by using the key board 110 and the mouse 111 or by deleting the part of global wiring data 710 that is detected by the detecting unit 208.

Figure 9:
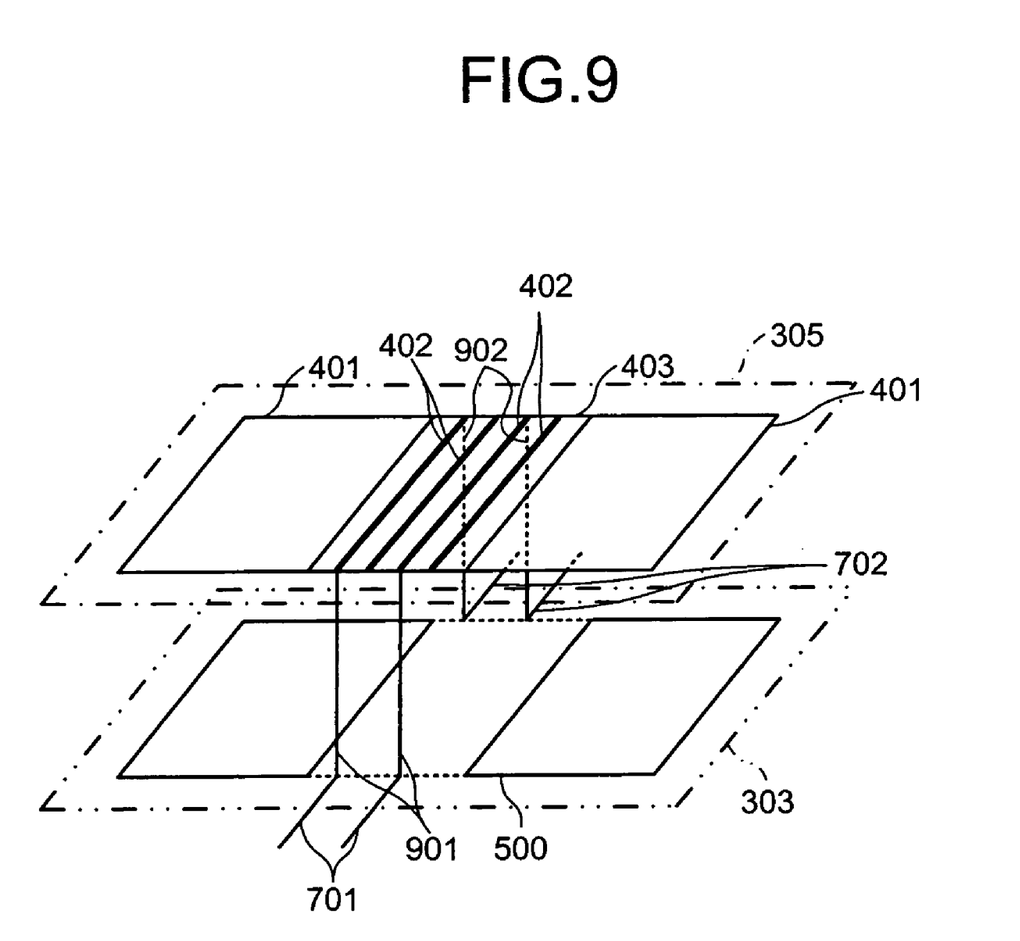
FIG. 9 is an explanatory diagram of connecting according to the embodiment of the present invention.

The connecting unit 207 connects the fixed-signal line segment of the cell that is arranged by the arranging unit 202 and the signal line that is wired by the wiring unit 205. Concretely, the connecting unit 207 connects the fixed-signal line segment data 402 of the cell data 400 that is arranged by the arranging unit 202 and the global wiring data 700 that is wired by the wiring unit 205. In other words, the connecting unit 207 connects the fixed-signal line segment data 402 and remaining global wiring data other than the part of global wiring data 710 that is deleted by the deleting unit 206.

The connecting is described below in detail. FIG. 9 is an illustration of connecting according to the embodiment of the present invention. Remaining global wiring data 701 and 702 formed in the third wiring-layer data 303 and the fixed-signal line segment data 402 formed in the fifth wiring-layer data 305 are connected.

In FIG. 9, the connecting unit 207 creates connecting-signal line segment data 901 and 902. Length of the connecting-signal line segment data 901 and 902 is a difference between the information of height of the fifth wiring-layer data 305 and the third wiring-layer data 303. The connecting-signal line segment data 901 and 902 are wired between edges of the remaining global wiring data 701 and 702 created by deletion by the deleting unit 206 and edge of the fixed-signal line segment data 402.

The detecting unit 208 detects whether the global wiring data 700 that is wired by the wiring unit 205 (see FIG. 7) passes through the cell data that is arranged by the arranging unit 202 (see FIG. 4). Concretely, the detecting unit 208 detects the part of global wiring data 710 that exists in the channel data 501 from among the global wiring data 700 that is wired by the wiring unit 205 as shown in FIG. 8.

The detection can be performed by comparing coordinate values of the global wiring data 700 and the channel data 501. In this case, the deleting unit 206 deletes a part of the global wiring that is detected by the detecting unit 208. Thus, the deletion can be executed automatically.

Functions of the arranging unit 202, the searching unit 204, the wiring unit 205, the deleting unit 206, the connecting unit 207, and the detecting unit 208 are realized by execution of a computer program recorded in the ROM 102, the RAM 103, the HD 105, and the FD 107 shown in FIG. 1.

Figure 10:
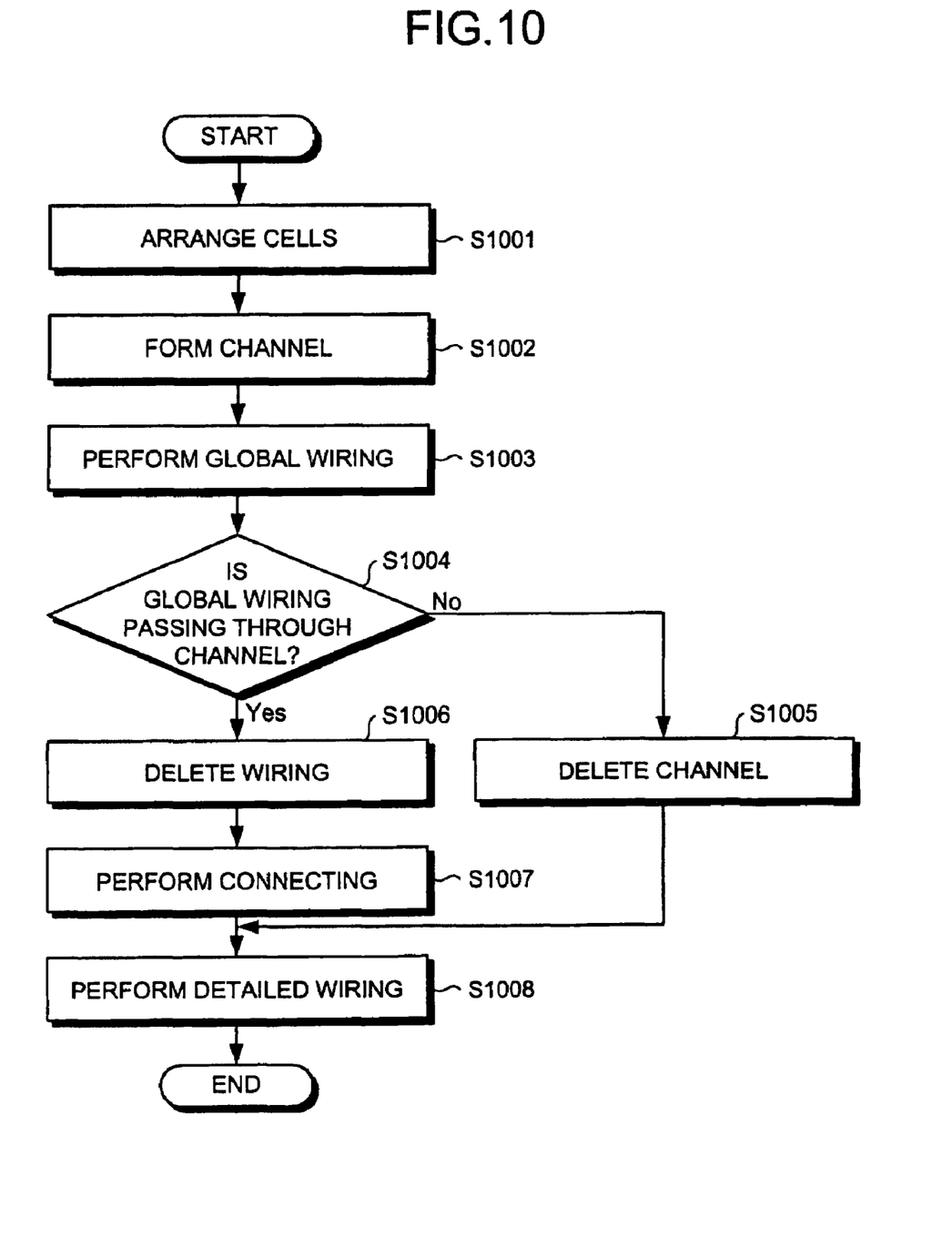
FIG. 10 is a flowchart of a procedure for layout designing according to the embodiment of the present invention.

FIG. 10 is a flowchart of a procedure for layout designing according to the embodiment of the present invention. As shown in FIG. 10, first, the cell is arranged (step S1001). The cell is arranged by inputting the cell data 400 in the LSI chip data 300 as shown in FIG. 4. By inputting the cell data 400, the upper-surface data 401 of the cell that includes the fixed-signal line segment data 402 is formed in the fifth wiring-layer data 305.

Next, the channel is formed (step S1002). In the channel formation, as shown in FIG. 5, the third wiring-layer data 303 that has the same wiring direction is determined to be the wiring-layer data subjected to the channel formation. In the third wiring-layer data 303, out of the upper-surface data 401 of the arranged cell data 400, an area in which only the coordinate value in the direction of height differs from that of the formation area 403 that includes the fixed-signal line segment data 402 is designated, and the channel data 501 is formed in this designated area 500.

Then, the wiring routine 600 of the global wiring is searched, and the global wiring is executed according to the wiring routine 600 searched (step 1003). In the global wiring, as shown in FIG. 7, the global wiring data 700 is superimposed on the third wiring-layer data 303.

After this, it is determined whether the global wiring is passing through the channel (step S1004). It may be determined by a designer visually checking on a display screen whether the global wiring data 700 is superimposed by the channel data 501, or by the detecting unit 208.

If the global wiring is not passing through the channel (step S1004: No), the channel is deleted (step S1005). On the other hand, if the global wiring is passing through the channel (step S1004: Yes), the wiring is deleted (step S1006). In the deletion of wiring, out of the global wiring data 700 that is wired by the wiring unit 205, the part of global wiring data 710 that exists in the channel data 501 is deleted as shown in FIG. 8.

Connecting is performed after the deletion of wiring (step S1007). In the connecting, the remaining global wiring data 701 and 702 formed in the third wiring-layer data 303 and the fixed-signal line segment data 402 formed in the fifth wiring-layer data 305 are connected as shown in FIG. 9.

Then, detailed wiring is performed (step S1008) after the connecting (step S1007) or the deletion of the channel (step S1005). The detailed wiring is performed in each of the lattice of the LSI chip shown in FIG. 3.

According to the present embodiment, the fixed-signal line segment that is prepared in advance enables to let the fifth wiring-layer to be the fixed wiring layer and it can be positioned as a wiring layer for crossing over the cell. Therefore, when the LSI is manufactured by using the LSI chip data 300 in which a layout is designed, the fixed wiring layer is only for the fixed-signal line segment and no new wiring is performed. As a result, a pattern of a mask layer for each of the LSI chip can be simplified for a single pattern. This enables to reduce cost and time for manufacturing.

Moreover, the global wiring is performed freely, and the global wiring wired is assigned to the fixed-signal line segment. Therefore, efficient layout designing can be performed compared to a case in which of the global wiring is assigned in advance before the global wiring is actually performed.

Furthermore, since only the channel is to be set before the global wiring and the fixed-signal line segment is to be assigned after the global wiring, the routine search, which is a core of the global wiring, is not required to be modified. Therefore, an existing routine search algorithm can be used without modification, and this realizes the layout designing with high general versatility.

Thus, according to the layout designing apparatus, the method of layout designing, the computer program for layout designing, and the recording medium, the fixed-signal line segment is set in advance in the cell, and the wiring is performed by using the fixed-signal line segment as a part of the wiring routine. This enables to simplify the pattern in the wiring layer for passing through the cell, and to reduce the number of mask layers required for each of the LSI chip.

The method of layout designing described in the embodiment can be realized by executing a computer program that is prepared in advance in a computer such a personal computer, a work station, and a CAD. This computer program is recorded in a computer readable recording medium, such as a hard disk, a flexible disk, a CD-ROM, an MO, and a DVD, and is executed by reading from the recording medium with the computer. This computer program may also be distributed by a network such as the Internet.

According to the present invention, the LSI chip can be manufactured in a shorter time and at a low cost.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for designing a layout of a large-scale-integrated chip having a multi-layered wiring structure, the apparatus comprising:
    an arranging unit that arranges, on a first wiring layer, a cell on which a signal line segment is formed;
    a forming unit that forms, on a second wiring layer, a channel at a position corresponding to the cell;
    a wiring unit that wires a signal line on the second wiring layer, extending across the channel;
    a deleting unit that deletes a segment of the signal line wired on and extending across the channel, associated segments of the signal line remaining on the second wiring layer outside the channel; and
    a connecting unit that connects the signal line segment on the cell with, and so as to interconnect, the remaining, associated signal line segments.

2. The apparatus according to claim 1, wherein the deleting unit deletes the channel if no signal line extends across the channel.

3. The apparatus according to claim 1, wherein the channel has an identical size to the cell and a different coordinate value in a height direction.

4. The apparatus according to claim 1, wherein the wiring unit wires the signal line based on a net list.

5. A method for designing a layout of a large-scale-integrated chip having a multi-layered wiring structure, comprising:
    arranging, on a first wiring layer, a cell on which a signal line segment is formed;
    forming, on a second wiring layer, a channel at a position corresponding to the cell;
    wiring a signal line on the second wiring layer, extending across the channel;
    deleting a segment of the signal line wired on and extending across the channel, associated signal line segments of the signal line remaining on the second wiring layer outside the channel; and
    connecting the signal line segment on the cell with, and so as to interconnect, the remaining, associated signal line segments.

6. The method according to claim 5, wherein the deleting unit deletes the channel if no signal line extends across the channel.

7. The method according to claim 5, wherein the channel has an identical size to the cell and a different coordinate value in a height direction.

8. The method according to claim 5, wherein the wiring unit wires the signal line based on a net list.

9. A computer-readable medium storing a program of instructions for controlling the computer to design a layout of a large-scale-integrated chip having a multi-layered wiring structure, by:

arranging, on a first wiring layer, a cell on which a signal line segment is formed; forming, on a second wiring layer, a channel at a position corresponding to the cell;

wiring a signal line on the second wiring layer, extending across the channel; deleting a segment of the signal line wired on and extending across the channel, associated signal line segments of the signal line remaining on the second wiring layer outside the channel; and connecting the signal line segment on the cell with, and so as to interconnect, the remaining, associated signal line segments.

10. A computer-readable medium according to claim 9, wherein the deleting unit deletes the channel if no signal line extends across the channel.

11. A computer-readable medium according to claim 9, wherein the channel has an identical size to the cell and a different coordinate value in a height direction.

12. A computer-readable medium according to claim 9, wherein the wiring unit wires the signal line based on a net list.

* * * * *